(12) United States Patent
Shimamune

(10) Patent No.: US 10,979,000 B2
(45) Date of Patent: *Apr. 13, 2021

(54) DIFFERENTIAL AMPLIFIER CIRCUIT

(71) Applicant: Murata Manufacturing Co., Ltd., Kyoto (JP)

(72) Inventor: Yusuke Shimamune, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/850,349

(22) Filed: Apr. 16, 2020

(65) Prior Publication Data

US 2020/0244229 A1 Jul. 30, 2020

Related U.S. Application Data

(63) Continuation of application No. 16/057,287, filed on Aug. 7, 2018, now Pat. No. 10,658,984.

(30) Foreign Application Priority Data

Aug. 8, 2017 (JP) .............................. JP2017-153345

(51) Int. Cl.
*H03F 1/08* (2006.01)
*H03F 3/45* (2006.01)

(52) U.S. Cl.
CPC .......... *H03F 1/086* (2013.01); *H03F 3/45183* (2013.01); *H03F 2200/267* (2013.01); *H03F 2203/45026* (2013.01); *H03F 2203/45342* (2013.01); *H03F 2203/45398* (2013.01); *H03F 2203/45511* (2013.01)

(58) Field of Classification Search
CPC ................. H03F 1/086; H03F 3/45183; H03F 2203/45398; H03F 2203/45342; H03F 2203/45026; H03F 2203/45511; H03F 2200/267; H03F 1/0211; H03F 3/45179; H03F 3/45659; H03F 3/45748
USPC .................................................. 330/252–261
See application file for complete search history.

(56) References Cited

U.S. PATENT DOCUMENTS 7,893,766 B1 * 2/2011 Cranford, Jr. ....... H03F 3/45632
330/258
8,970,302 B2 * 3/2015 Schulz ................ H03F 3/45192
330/257
9,921,595 B2 3/2018 Nakamoto
(Continued)

FOREIGN PATENT DOCUMENTS

JP 2005-204297 A 7/2005
JP 2012-199664 A 10/2012
JP 2013-126129 A 6/2013

*Primary Examiner* — Hieu P Nguyen
(74) *Attorney, Agent, or Firm* — Pearne & Gordon LLP

(57) ABSTRACT

A differential amplifier circuit includes a differential pair including a first field-effect transistor (FET) and a second FET, a first current source that generates a current which flows in the first FET and the second FET, and an output circuit that outputs an output voltage corresponding to a difference between a gate voltage of the first FET and a gate voltage of the second FET in accordance with an operation of the differential pair. A back gate of the first FET is connected to a gate of the first FET, and a back gate of the second FET is connected to a gate of the second FET. A first feedback voltage corresponding to the output voltage is input to the gate of the second FET.

9 Claims, 9 Drawing Sheets

(56) References Cited

U.S. PATENT DOCUMENTS 10,396,729 B2 8/2019 Iwamoto
2005/0134384 A1 6/2005 Sato

\* cited by examiner

US 10,979,000 B2

DIFFERENTIAL AMPLIFIER CIRCUIT

This is a continuation of U.S. patent application Ser. No. 16/057,287 filed on Aug. 7, 2018 which claims priority from Japanese Patent Application No. 2017-153345 filed on Aug. 8, 2017. The contents of these applications are incorporated herein by reference in their entireties.

BACKGROUND

The present disclosure relates to a differential amplifier circuit. In the related art, a buffer, a voltage regulator, or a circuit that generates a reference voltage includes a differential amplifier circuit including a differential pair constituted by field-effect transistors (FETs). For example, Japanese Unexamined Patent Application Publication No. 2013-126129 discloses an amplifier configured such that each of FETs constituting a differential pair has a bulk terminal (hereinafter also referred to as a "back gate") which is supplied with a voltage corresponding to an input signal input to a gate terminal of the FET.

In a typical differential amplifier circuit, two FETs constituting a differential pair have preferably equal characteristics. In actuality, however, the characteristics of the two FETs may not be completely identical due to production variations of the FETs, temperature differences, or other factors. In this respect, the configuration disclosed in Japanese Unexamined Patent Application Publication No. 2013-126129 does not take such a characteristic mismatch between the FETs into account. Thus, it is difficult to obtain a desired output voltage, and variations may occur in an output voltage.

BRIEF SUMMARY

Accordingly, the present disclosure provides a differential amplifier circuit with reduced variations in output voltage even if FETs constituting a differential pair have different characteristics.

According to embodiments of the present disclosure, a differential amplifier circuit includes a differential pair including a first FET and a second FET, a first current source that generates a current which flows in the first FET and the second FET, and an output circuit that outputs an output voltage corresponding to a difference between a gate voltage of the first FET and a gate voltage of the second FET in accordance with an operation of the differential pair. A back gate of the first FET is connected to a gate of the first FET, and a back gate of the second FET is connected to a gate of the second FET. A first feedback voltage corresponding to the output voltage is input to the gate of the second FET.

According to embodiments of the present disclosure, it may be possible to provide a differential amplifier circuit with reduced variations in output voltage even if FETs constituting a differential pair have different characteristics.

Other features, elements, characteristics and advantages of the present disclosure will become more apparent from the following detailed description of embodiments of the present disclosure with reference to the attached drawings.

DETAILED DESCRIPTION

Embodiments of the present disclosure will be described in detail hereinafter with reference to the drawings. The same or substantially the same elements bear the same numerals and will not be repeatedly described.

Figure 1:
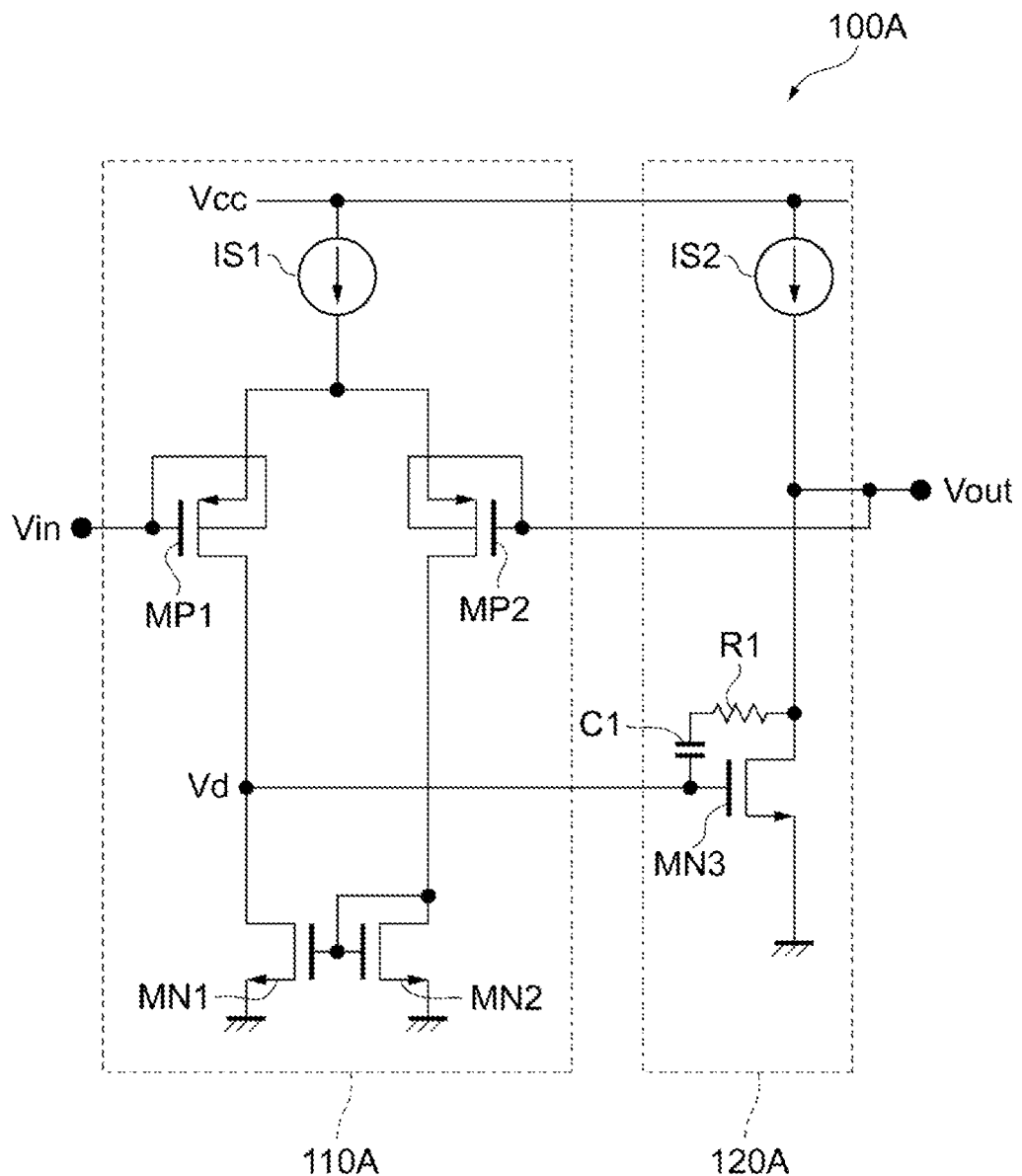
FIG. 1 is a circuit diagram illustrating the configuration of a differential amplifier circuit according to a first embodiment of the present disclosure.

FIG. 1 is a circuit diagram illustrating the configuration of a differential amplifier circuit 100A according to a first embodiment of the present disclosure. The differential amplifier circuit 100A illustrated in FIG. 1 constitutes a so-called voltage follower circuit. Specifically, the differential amplifier circuit 100A includes an initial-stage circuit 110A and an output circuit 120A, and the initial-stage circuit 110A includes a differential pair. The initial-stage circuit 110A includes, for example, P-channel metal oxide semiconductor field-effect transistors (MOSFETs) (MP1 and MP2), N-channel MOSFETs (MN1 and MN2), and a current source IS1. The output circuit 120A includes an N-channel MOSFET (MN3), a current source IS2, a resistor element R1, and a capacitor C1. The individual components will be described specifically.

The P-channel MOSFETs (MP1 and MP2) constitute a differential pair. Specifically, the P-channel MOSFET (MP1) (first FET) has a source connected to a source of the P-channel MOSFET (MP2), a gate to which an input voltage Vin is input, and a drain connected to a drain of the N-channel MOSFET (MN1). The P-channel MOSFET (MP2) (second FET) has the source, which is connected to the source of the P-channel MOSFET (MP1), a gate to which an output voltage Vout (first feedback voltage) is input, and a drain connected to a drain of the N-channel MOSFET (MN2). A current generated by the current source IS1 (first current source) flows between the sources and drains of the P-channel MOSFETs (MP1 and MP2). When the differential amplifier circuit 100A is considered as an operational amplifier, the gate of one of the P-channel MOSFETs (MP1 and MP2), namely, the P-channel MOSFET (MP1), serves as a non-inverting input terminal, and the gate of the other P-channel MOSFET (MP2) serves as an inverting input terminal. In addition, the output voltage Vout of the differential amplifier circuit 100A (i.e., the output voltage of the output circuit 120A) is input to the gate of the P-channel MOSFET (MP2) (i.e., the inverting input terminal), thereby forming a voltage follower circuit. In this embodiment, each of the P-channel MOSFETs (MP1 and MP2) has a back gate connected to the gate thereof. The effect of the connection of the back gate to the gate will be described below.

The N-channel MOSFETs (MN1 and MN2) form a current mirror circuit and function as a load of the differential pair. Specifically, the N-channel MOSFET (MN1) has the drain, which is connected to the drain of the P-channel MOSFET (MP1), a gate connected to a gate of the N-channel MOSFET (MN2), and a source grounded. The N-channel MOSFET (MN2) has the drain, which is connected to the drain of the P-channel MOSFET (MP2), the gate, which is connected to the drain thereof, and a source grounded. If the N-channel MOSFETs (MN1 and MN2) have an equal size, currents flowing through the N-channel MOSFETs (MN1 and MN2) are equal. If the P-channel MOSFETs (MP1 and MP2) constituting the differential pair have different sizes, the ratio of the sizes of the N-channel MOSFETs (MN1 and MN2) may be equal to the ratio of the sizes of the P-channel MOSFETs (MP1 and MP2).

The N-channel MOSFET (MN3) has a drain to which a current is supplied from the current source IS2, a gate to which a drain voltage Vd of the P-channel MOSFET (MP1) (i.e., the drain voltage Vd of the N-channel MOSFET (MN1)) is input, and a source grounded. The N-channel MOSFET (MN3) outputs the output voltage Vout from the drain thereof.

The resistor element R1 and the capacitor C1 are connected in series between the drain and gate of the N-channel MOSFET (MN3). The resistor element R1 and the capacitor C1 are phase compensation elements for suppressing oscillation caused by a phase difference between an input voltage and an output voltage in a negative feedback loop described below.

The current source IS1 (first current source) and the current source IS2 supply current to the P-channel MOSFETs (MP1 and MP2) and the N-channel MOSFET (MN3), respectively. Specifically, the current sources IS1 and IS2 may be each configured to supply a current generated with a current mirror circuit, for example. Current sources IS3 to IS9 below are also configured in a similar fashion.

With the configuration described above, in accordance with the operation of the differential pair, the differential amplifier circuit 100A outputs the output voltage Vout corresponding to a difference between the gate voltage of the P-channel MOSFET (MP1) (i.e., the input voltage Vin) and the gate voltage of the P-channel MOSFET (MP2) (i.e., the output voltage Vout). Specifically, for example, when the output voltage Vout is higher than the input voltage Vin, the voltage between the gate and source of the P-channel MOSFET (MP2) is decreased and the current flowing through the P-channel MOSFET (MP2) is decreased. Thus, the current flowing through the N-channel MOSFET (MN2) is decreased, whereas the current flowing through the N-channel MOSFET (MN1) is increased. Accordingly, the drain voltage Vd of the N-channel MOSFET (MN1) is increased, and the current flowing through the N-channel MOSFET (MN3) is increase. As a result, the output voltage Vout is decreased. For example, when the output voltage Vout is lower than the input voltage Vin, in accordance with the operation opposite to that described above, the output voltage Vout is increased. In the differential amplifier circuit 100A, therefore, negative feedback is exerted so as to output the output voltage Vout equal to the input voltage Vin.

In a differential amplifier circuit, two MOSFETs constituting a differential pair can have equal characteristics (i.e., the MOSFETs mismatch very small). In actuality, however, the characteristics of the two MOSFETs may not be completely identical due to production variations of the MOSFETs, temperature differences, or other factors. In this case, it is difficult to obtain the desired output voltage Vout with respect to the input voltage Vin, and variations may occur in the output voltage Vout.

In this respect, in the differential amplifier circuit 100A, the respective back gates of the P-channel MOSFETs (MP1 and MP2) constituting the differential pair are connected to the respective gates thereof. This configuration can eliminate or reduce variations in the output voltage Vout even if the two MOSFETs have different characteristics. This point will be described hereinbelow with reference to FIG. 2.

Figure 2:
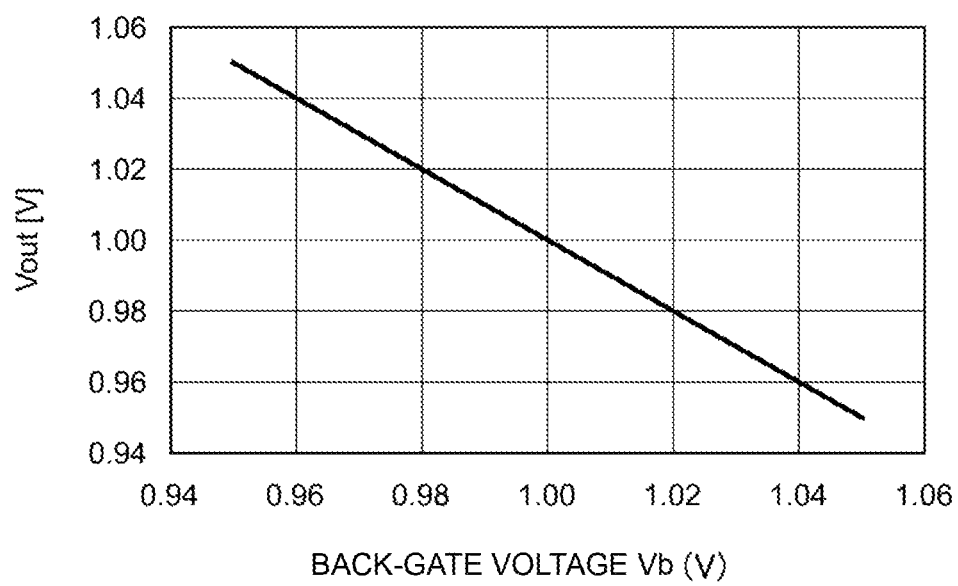
FIG. 2 illustrates simulation results for an output voltage with changes in a back-gate voltage of one of P-channel metal oxide semiconductor field-effect transistors (MOSFETs) constituting a differential pair.

FIG. 2 illustrates simulation results for an output voltage with changes in the back-gate voltage of one of P-channel MOSFETs constituting a differential pair. In this simulation, instead of the connection of the back gate of the P-channel MOSFET (MP2) in the differential amplifier circuit 100A illustrated in FIG. 1 to the gate thereof, application of changing voltages to the back gate of the P-channel MOSFET (MP2) is employed. In a graph illustrated in FIG. 2, the horizontal axis represents the back-gate voltage Vb (V) of the P-channel MOSFET (MP2) and the vertical axis represents the output voltage Vout (V).

Typically, as the voltage applied to the back gate of a MOSFET fluctuates, a threshold voltage fluctuates (a substrate-bias effect). Specifically, when the back-gate voltage of a MOSFET is decreased, the threshold voltage is decreased. In contrast, when the back-gate voltage of a MOSFET is increased, the threshold voltage is increased. For example, when the back-gate voltage Vb of the P-channel MOSFET (MP2) illustrated in FIG. 1 is increased, due to the substrate-bias effect, the threshold voltage for the P-channel MOSFET (MP2) is increase. This causes a further decrease in the current flowing through the P-channel MOSFET (MP2), compared with the configuration in which the back-gate voltage Vb of the P-channel MOSFET (MP2) does not fluctuate. Thus, as described above, the current flowing through the N-channel MOSFET (MN2) is decreased, whereas the current flowing through the N-channel MOSFET (MN1) is increased. Accordingly, the drain voltage Vd of the N-channel MOSFET (MN1) is increased, and the current flowing through the N-channel MOSFET (MN3) is increase. As a result, the output voltage Vout is decreased. In this way, as illustrated in FIG. 2, the back-gate voltage Vb and the output voltage Vout have a negative correlation.

Referring back to FIG. 1, in the differential amplifier circuit 100A, the back gate of the P-channel MOSFET (MP2) is connected to the gate thereof. Thus, if there is a difference between the gate voltage of the P-channel MOSFET (MP1) and the gate voltage of the P-channel MOSFET (MP2), the difference also affects the back-gate voltage and negative feedback is exerted in a direction such that fluctuations in the output voltage Vout are suppressed. Accordingly, the output voltage Vout is generated so as to be more equal to the input voltage Vin. Specifically, for example, when the gate voltage of the P-channel MOSFET (MP2) is higher than the gate voltage of the P-channel MOSFET (MP1), the back-gate voltage of the P-channel MOSFET (MP2) also becomes high. Accordingly, the threshold voltage for the P-channel MOSFET (MP2) becomes high. This causes a further decrease in the current flowing through the P-channel MOSFET (MP2), compared with the configuration in which the back gate of the P-channel MOSFET (MP2) is not connected to the gate thereof. In this way, negative feedback is strongly exerted in the differential amplifier circuit 100A. To match the threshold voltage for the P-channel MOSFET (MP2), the back gate of the P-channel MOSFET (MP1) is also connected to the gate thereof.

With the configuration described above, in the differential amplifier circuit 100A, negative feedback is strongly exerted even if two MOSFETs constituting a differential pair mismatch very large, which can eliminate or reduce variations in the output voltage Vout.

Figure 3A:
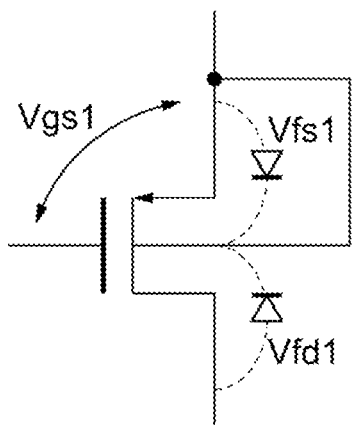
FIG. 3A illustrates an influence of parasitic diodes generated by the connection of a back gate to a gate.
Figure 3B:
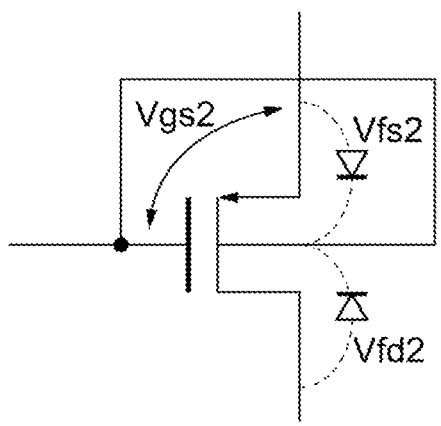
FIG. 3B illustrates an influence of parasitic diodes generated by the connection of a back gate to a gate.

FIG. 3A and FIG. 3B illustrate an influence of parasitic diodes generated by the connection of a back gate to a gate. A MOSFET can typically include parasitic diodes between the source and back gate thereof and between the back gate and drain thereof. FIG. 3A and FIG. 3B are diagrams for comparing the influences of parasitic diodes. Specifically, FIG. 3A illustrates a typical configuration in which a P-channel MOSFET has a back gate connected to a source thereof. In contrast, FIG. 3B illustrates a configuration in which, as with the P-channel MOSFETs (MP1 and MP2) in the differential amplifier circuit 100A, a P-channel MOSFET has a back gate connected to a gate thereof.

In FIG. 3A, since the back gate is connected to the source, a source to back-gate voltage Vfs1 is 0 V. Further, a back-gate to drain voltage Vfd1 is the reverse bias voltage. Thus, substantially no consideration is given to unwanted current flow through the back gate due to the influence of the parasitic diodes.

In FIG. 3B, in contrast, since the back gate is connected to the gate, a source to back-gate voltage Vfs2 occurs. Thus, there may cause unwanted current flow through the back gate due to the influence of the parasitic diodes. However, if a gate-source voltage Vgs2 is lower than the source to back-gate voltage Vfs2 (Vgs2<Vfs2), the current flow through the back gate is suppressed. In addition, when FIG. 3A and FIG. 3B are compared, since the back gate is connected to the gate rather than to the source in FIG. 3B, the voltage at the back gate is reduced by an amount corresponding to ΔVgs (=Vgs1−Vgs2). Accordingly, the substrate-bias effect reduces the threshold voltage. Since Vgs2<Vgs1 holds true, Vgs2<Vfs2 is more likely to hold true.

Between the back gate and the drain, the forward direction of the parasitic diode is set if the drain voltage is higher than the gate voltage. However, the source voltage is higher than the drain voltage. Thus, no consideration is given to the influence of the parasitic diodes if Vfd2>Vgs2 holds true.

Accordingly, the differential amplifier circuit 100A can exert the substrate-bias effect on negative feedback while suppressing the influences of the parasitic diodes caused by the connection of the back gates of the P-channel MOSFETs (MP1 and MP2) to the gates thereof.

Figure 4:
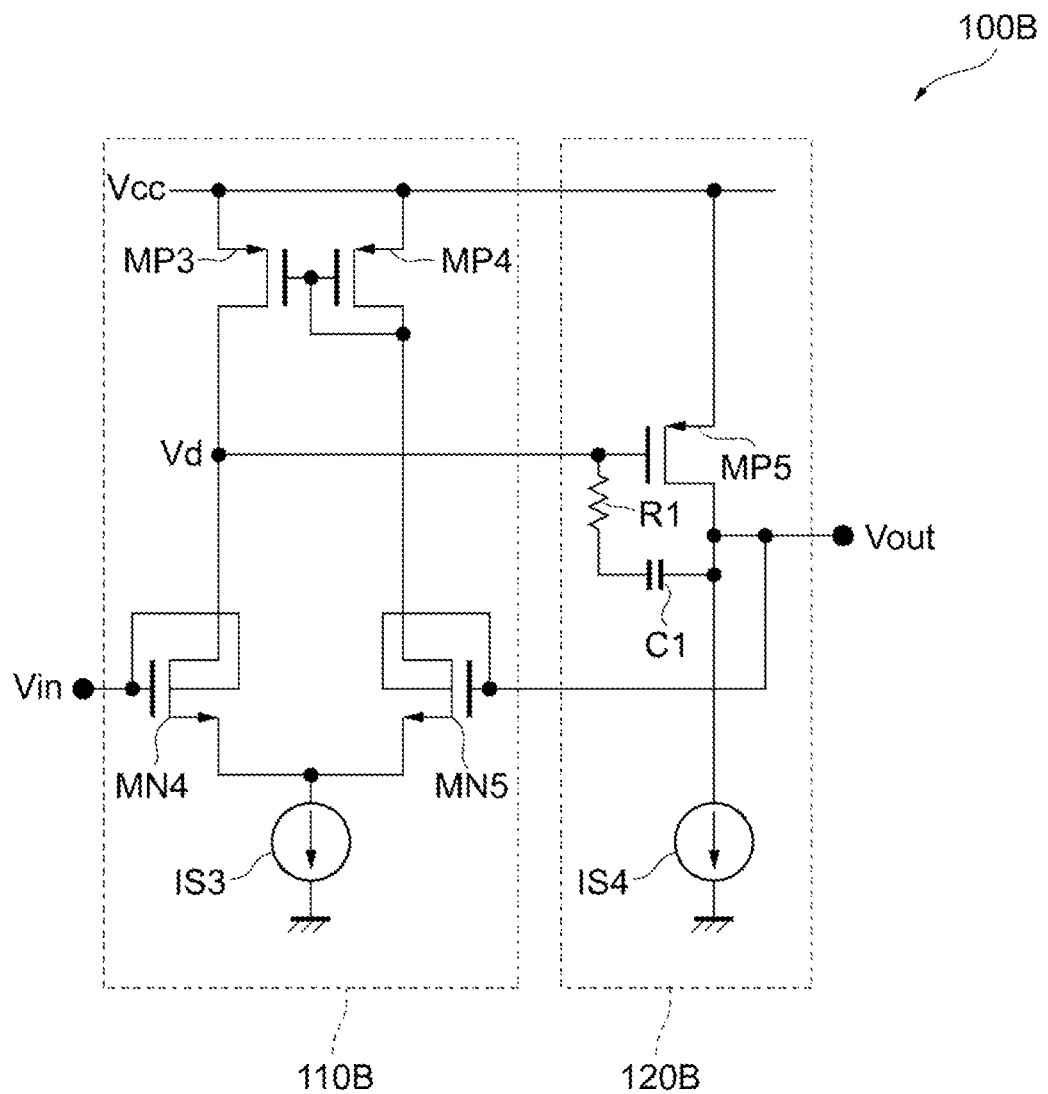
FIG. 4 is a circuit diagram illustrating the configuration of a differential amplifier circuit according to a second embodiment of the present disclosure.

FIG. 4 is a circuit diagram illustrating the configuration of a differential amplifier circuit 100B according to a second embodiment of the present disclosure. The same or substantially the elements as those in the differential amplifier circuit 100A illustrated in FIG. 1 bear the same numerals and will not be described again. In the second and subsequent embodiments, features common to the first embodiment will not be described again and only the differences are described. In particular, similar effects achieved by similar configurations will not be repeatedly described in the individual embodiments.

In the differential amplifier circuit 100B illustrated in FIG. 4, a differential pair is constituted by N-channel MOSFETs instead of by P-channel MOSFETs. Specifically, the differential amplifier circuit 100B includes an initial-stage circuit 110B, and the initial-stage circuit 110B includes, for example, N-channel MOSFETs (MN4 and MN5), P-channel MOSFETs (MP3 and MP4), and a current source IS3. The differential amplifier circuit 100B further includes an output circuit 120B, and the output circuit 120B includes a P-channel MOSFET (MP5), a current source IS4, the resistor element R1, and the capacitor C1.

The N-channel MOSFETs (MN4 and MN5) constitute a differential pair. Specifically, the N-channel MOSFET (MN4) (first FET) has a drain connected to a drain of the P-channel MOSFET (MP3), a gate to which the input voltage Vin is input, and a source connected to a source of the N-channel MOSFET (MN5). The N-channel MOSFET (MN5) (second FET) has a drain connected to a drain of the P-channel MOSFET (MP4), a gate to which the output voltage Vout (first feedback voltage) is input, and the source, which is connected to the source of the N-channel MOSFET (MN4). In addition, a current generated by the current source IS3 (first current source) flows between the drains and sources of the N-channel MOSFETs (MN4 and MN5). Each of the N-channel MOSFETs (MN4 and MN5) further has a back gate connected to the gate thereof.

The P-channel MOSFETs (MP3 and MP4) form a current mirror circuit and function as a load of the differential pair. Specifically, the P-channel MOSFET (MP3) has a source to which a power supply voltage Vcc is supplied, a gate connected to a gate of the P-channel MOSFET (MP4), and the drain, which is connected to the drain of the N-channel MOSFET (MN4). The P-channel MOSFET (MP4) has a source to which the power supply voltage Vcc is supplied, a gate connected to the drain thereof, and the drain, which is connected to the drain of the N-channel MOSFET (MN5).

The P-channel MOSFET (MP5) has a source to which the power supply voltage Vcc is supplied, and a gate to which the drain voltage Vd of the N-channel MOSFET (MN4) is input. A current generated by the current source IS4 flows between the source and drain of the P-channel MOSFET (MP5). The P-channel MOSFET (MP5) outputs the output voltage Vout from the drain thereof.

With the configuration described above, in the differential amplifier circuit 100B, as in the differential amplifier circuit 100A, negative feedback is exerted so as to make the input voltage Vin and the output voltage Vout equal. In addition, the back gates of the two N-channel MOSFETs (MN4 and MN5) constituting the differential pair are connected to the gates thereof, which allows negative feedback to be strongly exerted. Accordingly, even if two MOSFETs constituting a differential pair have a weak paired relationship, the differential amplifier circuit 100B can eliminate or reduce variations in the output voltage Vout.

For example, in the differential amplifier circuit 100A illustrated in FIG. 1, when the input voltage Vin is close to the power supply voltage Vcc and the gate-source voltages of the P-channel MOSFETs (MP1 and MP2) are less than or equal to a threshold voltage, the P-channel MOSFETs (MP1 and MP2) are turned off and disabled. Thus, for example, if the power supply voltage Vcc is decreased, the upper limits of the input voltage Vin and the output voltage Vout may become low. In this respect, the differential amplifier circuit 100B can operate even if the input voltage Vin is in the vicinity of the power supply voltage Vcc. In the differential amplifier circuit 100B, therefore, the upper limits of the input voltage Vin and the output voltage Vout are higher than those in the differential amplifier circuit 100A, and the dynamic range can be shifted toward the power supply voltage Vcc.

Figure 5:
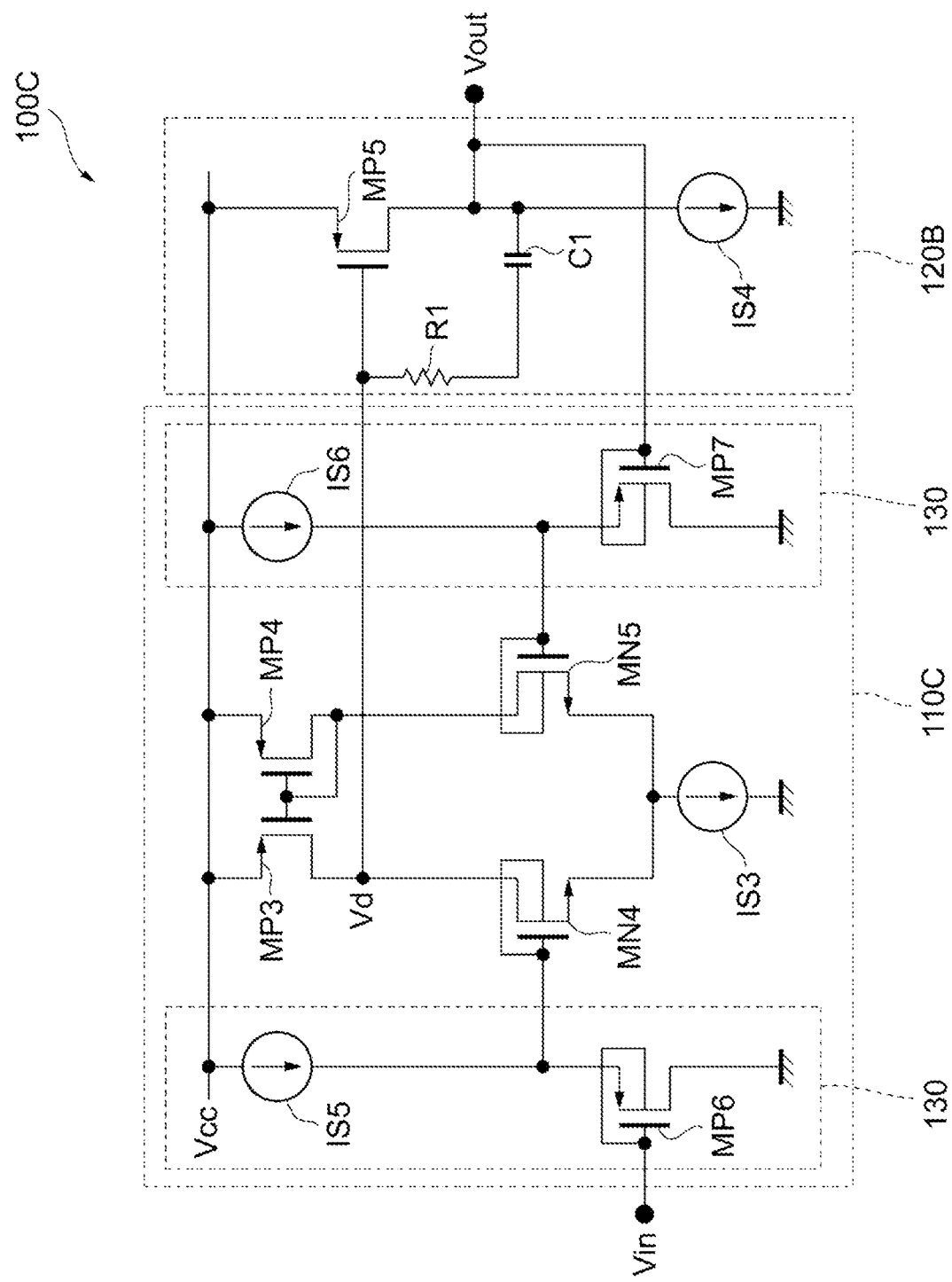
FIG. 5 is a circuit diagram illustrating the configuration of a differential amplifier circuit according to a third embodiment of the present disclosure.

FIG. 5 is a circuit diagram illustrating the configuration of a differential amplifier circuit 100C according to a third embodiment of the present disclosure. Unlike the differential amplifier circuit 100B illustrated in FIG. 4, the differential amplifier circuit 100C illustrated in FIG. 5 includes an initial-stage circuit 110C further including a level shifter circuit 130. The level shifter circuit 130 includes, for example, P-channel MOSFETs (MP6 and MP7) and current sources IS5 and IS6.

The P-channel MOSFET (MP6) (third FET) has a source connected to the gate of the N-channel MOSFET (MN4), a gate to which the input voltage Vin is input, and a drain grounded. The P-channel MOSFET (MP7) (fourth FET) has a source connected to the gate of the N-channel MOSFET (MN5), a gate to which the output voltage Vout (first feedback voltage) is input, and a drain grounded. In addition, currents generated by the current sources IS5 (second current source) and IS6 (second current source) flow between the sources and drains of the P-channel MOSFETs (MP6 and MP7), respectively. Thus in a situation when the current sources IS5 and IS6 are substantially similar and output a substantially similar current, and the P-channel MOSFETs (MP6 and MP7) have substantially similar characteristics (so that mismatch very small), the current that flows through the P-channel MOSFETs (MP6 and MP7) is substantially similar. Substantially similar currents through the P-channel MOSFETs (MP6 and MP7) can also be maintained with slightly different output currents that account for any mismatch between the P-channel MOSFETs (MP6 and MP7). Furthermore, it is desirable that the P-channel MOSFETs (MP6 and MP7) have a paired relationship in a way similar to that for the N-channel MOSFETs (MN4 and MN5). Accordingly, the back gate of each of the P-channel MOSFETs (MP6 and MP7) is connected to the gate thereof.

The differential amplifier circuit 100C is provided with the level shifter circuit 130, which allows a voltage obtained by boosting the input voltage Vin by an amount corresponding to the gate-source voltage of the P-channel MOSFET (MP6) to be input to the gate of the N-channel MOSFET (MN4). Likewise, a voltage obtained by boosting the output voltage Vout by an amount corresponding to the gate-source voltage of the P-channel MOSFET (MP7) is input to the gate of the N-channel MOSFET (MN5).

With the configuration described above, even if two MOSFETs constituting a differential pair have a weak paired relationship, the differential amplifier circuit 100C can also eliminate or reduce variations in the output voltage Vout in a way similar to that in the differential amplifier circuit 100B.

For example, in the differential amplifier circuit 100B illustrated in FIG. 4, when the input voltage Vin is close to a ground voltage and the gate-source voltages of the N-channel MOSFETs (MN4 and MN5) are less than or equal to a threshold voltage, the N-channel MOSFETs (MN4 and MN5) are turned off and disabled. In this respect, in the differential amplifier circuit 100C, even if the input voltage Vin and the output voltage Vout are in the vicinity of the ground voltage, voltages obtained by boosting are input to the gates of the N-channel MOSFETs (MN4 and MN5), which enables the N-channel MOSFETs (MN4 and MN5) to operate. In the differential amplifier circuit 100C, therefore, the lower limits of the input voltage Vin and the output voltage Vout are lower than those in the differential amplifier circuit 100B, and the dynamic range can be shifted toward the ground potential.

In this embodiment, the back gates of the P-channel MOSFETs (MP6 and MP7) are connected to the gates thereof. However, the back gates of the P-channel MOSFETs (MP6 and MP7) may not necessarily be connected to the gates thereof and may be connected to the sources thereof, for example.

Figure 6:
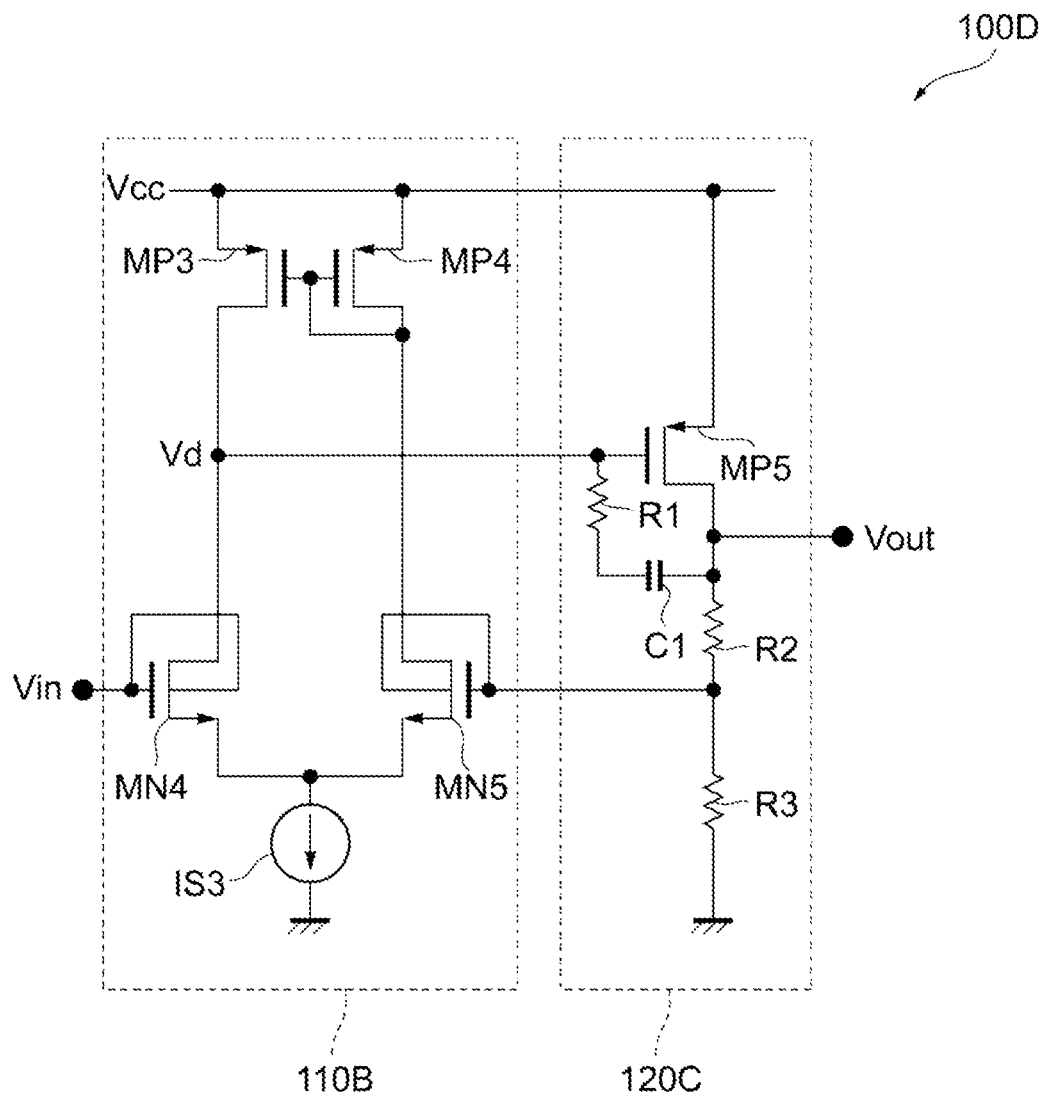
FIG. 6 is a circuit diagram illustrating the configuration of a differential amplifier circuit according to a fourth embodiment of the present disclosure.

FIG. 6 is a circuit diagram illustrating the configuration of a differential amplifier circuit 100D according to a fourth embodiment of the present disclosure. The differential amplifier circuit 100D illustrated in FIG. 6 constitutes a boost regulator circuit. Specifically, unlike the differential amplifier circuit 100B, the differential amplifier circuit 100D includes an output circuit 120C including resistor elements R2 and R3 instead of the current source IS4.

The resistor elements R2 and R3 are connected in series between the drain of the P-channel MOSFET (MP5) (i.e., the terminal from which the output voltage Vout is output) and ground. Specifically, the resistor element R2 (first load) has an end connected to the drain of the P-channel MOSFET (MP5) and another end connected to an end of the resistor element R3. The resistor element R3 (second load) has another end grounded.

In this embodiment, the output voltage Vout is not input directly to the gate of the N-channel MOSFET (MN5), but a voltage corresponding to the output voltage Vout is input to the gate of the N-channel MOSFET (MN5). Specifically, a voltage (first feedback voltage) at the node of the resistor elements R2 and R3 is input to the gate of the N-channel MOSFET (MN5). That is, a voltage obtained by dividing the output voltage Vout by the resistance values of the resistor elements R1 and R2 is input to the gate of the N-channel MOSFET (MN5). In other words, the differential amplifier circuit 100D can output the output voltage Vout, which is higher than the input voltage Vin (=the gate voltage of the N-channel MOSFET (MN5)).

With the configuration described above, even if two MOSFETs constituting a differential pair have a weak paired relationship, the differential amplifier circuit 100D can also eliminate or reduce variations in the output voltage Vout in a way similar to that in the differential amplifier circuit 100A. In addition, the differential amplifier circuit 100D can output a desired voltage obtained by boosting the input voltage Vin.

Instead of the resistor elements R2 and R3, any other load may divide the output voltage Vout.

Figure 7:
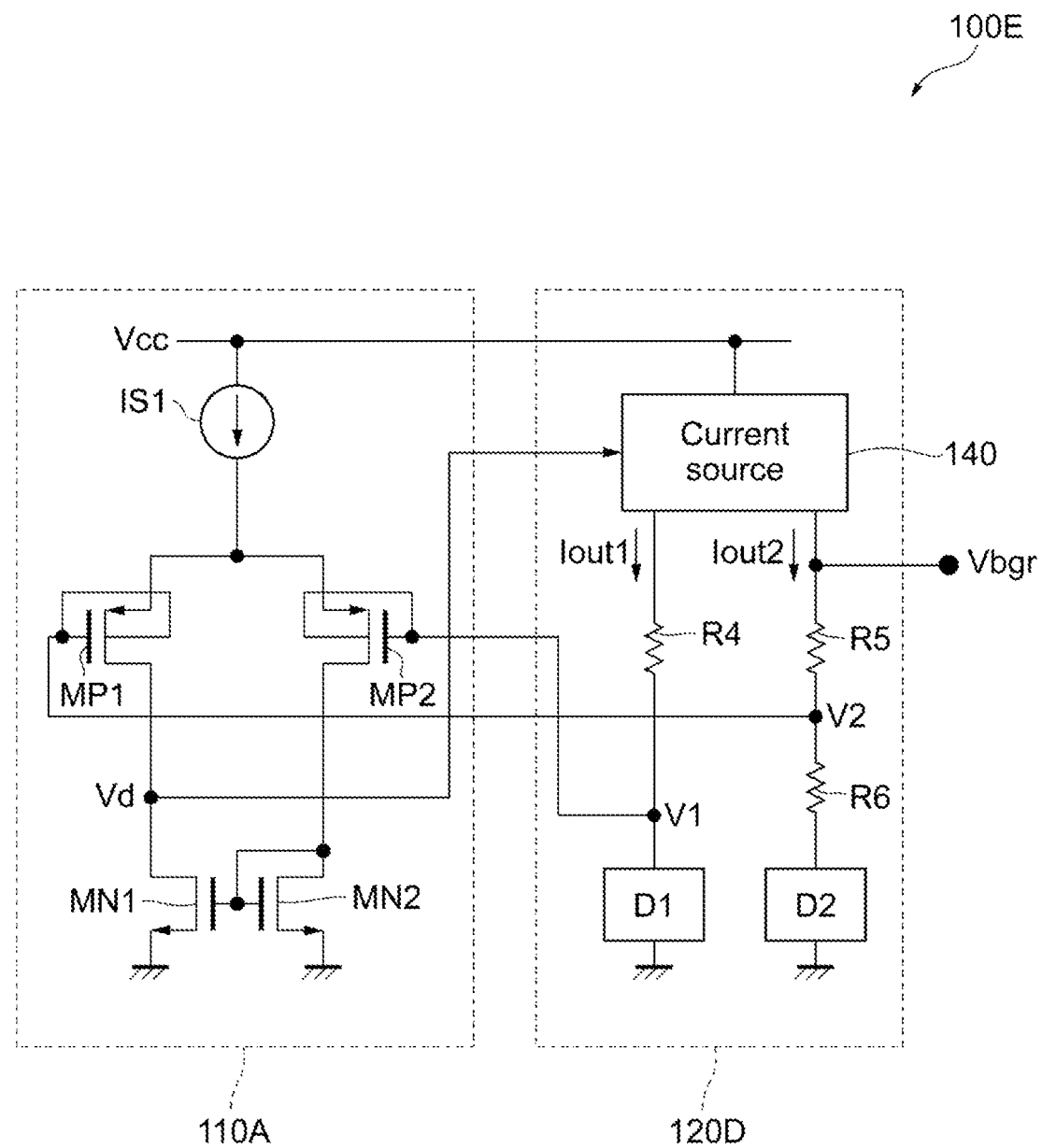
FIG. 7 is a circuit diagram illustrating the configuration of a differential amplifier circuit according to a fifth embodiment of the present disclosure.

FIG. 7 is a circuit diagram illustrating the configuration of a differential amplifier circuit 100E according to a fifth embodiment of the present disclosure. The differential amplifier circuits 100A to 100D described above are circuits that output the output voltage Vout corresponding to the input voltage Vin, whereas the differential amplifier circuit 100E illustrated in FIG. 7 is a voltage generation circuit that outputs a predetermined output voltage Vbgr. Specifically, for example, the differential amplifier circuit 100E constitutes a bandgap reference circuit.

The differential amplifier circuit 100E includes an initial-stage circuit 110A having components similar to those of the initial-stage circuit 110A illustrated in FIG. 1. Unlike the initial-stage circuit 110A illustrated in FIG. 1, a voltage V2 (second feedback voltage) and a voltage V1 (first feedback voltage), each of which corresponds to the output voltage Vbgr, are input to the gates of the P-channel MOSFETs (MP1 and MP2), respectively. In the differential amplifier circuit 100E, the differential pair operate to make the voltage V2 and the voltage V1 equal.

An output circuit 120D includes a current source 140, resistor elements R4 to R6, and diodes D1 and D2.

The current source 140 (third current source) receives the drain voltage Vd of the P-channel MOSFET (MP1) and outputs a current Iout1 (first current) and a current Iout2 (second current), which correspond to the drain voltage Vd (i.e., correspond to the output voltage Vbgr). Specifically, the current source 140 generates the currents Iout1 and Iout2 such that the amount of the currents Iout1 and Iout2 increases when the drain voltage Vd is increased and the amount of the currents Iout1 and Iout2 decreases when the drain voltage Vd is decreased. In this embodiment, furthermore, the amount of the current Iout1 and the amount of the current Iout2 are assumed to be equal.

The resistor element R4 and the diode D1 (third load) are connected in series between the output of the current source 140 and ground and are supplied with the current Iout1. Accordingly, the voltage V1 (first feedback voltage), which is obtained by converting the current Iout1 through the current-voltage conversion characteristic of the diode D1, is output from the node between the resistor element R4 and the diode D1. The resistor elements R5 and R6 and the diode D2 (fourth load) are connected in series between the output of the current source 140 and ground and are supplied with the current Iout2. Accordingly, the voltage V2 (second feedback voltage), which is obtained by converting the current Iout2 through the current-voltage conversion characteristic of the resistor element R6 and the diode D2, is output from the node of the resistor elements R5 and R6. The current Iout2 flows through the resistor element R5, thereby allowing the resistor element R5 to output the output voltage Vbgr, which is obtained by increasing the voltage V2 by an amount corresponding to the desired voltage, from the end thereof close to the current source 140. The resistor element R4 is arranged so as to correspond to the resistor element R5 in order to keep voltages uniform on the outputs of the current source 140 for the current Iout1 and the current Iout2.

The diode D1 is assumed to have a size smaller than the diode D2 and to have a high resistance value. That is, the resistance value of the diode D1 is equal to the resistance value of a combined resistor of the resistor element R6 and the diode D2. Accordingly, the voltage V1 and the voltage V2 are equal.

The voltage V2 (second feedback voltage) is input to the gate of the P-channel MOSFET (MP1) (first FET), and thus a negative feedback loop including the P-channel MOSFET (MP1) is formed. Specifically, for example, when the voltage V2 is higher than the voltage V1, the amount of current flowing through the P-channel MOSFET (MP1) is decreased and the amount of current flowing through the N-channel MOSFET (MN1) is also decreased. Thus, the drain voltage Vd is decreased and, as a result, the current Iout2 output from the current source 140 is decreased. Accordingly, the voltage V2 is decreased. In this way, negative feedback is exerted in the loop including the P-channel MOSFET (MP1).

In contrast, the voltage V1 (first feedback voltage) is input to the gate of the P-channel MOSFET (MP2) (second FET), and thus a positive feedback loop including the P-channel MOSFET (MP2) is formed. Specifically, for example, when the voltage V1 is lower than the voltage V2, the amount of current flowing through the P-channel MOSFET (MP2) is increased and the amount of current flowing through the N-channel MOSFET (MN2) is also increased. Thus, the amount of current flowing through the N-channel MOSFET (MN1) is decreased, which leads to a decrease in the drain voltage Vd, and, as a result, the current Iout1 output from the current source 140 is decreased. Accordingly, the voltage V1 is decreased. In this way, positive feedback is exerted in the loop including the P-channel MOSFET (MP2).

The voltage V1 is generated by the current-voltage conversion characteristic of the diode D1 to which the current Iout1 is supplied, whereas the voltage V2 is generated by the sum of the current-voltage conversion characteristics of the diode D2 and the resistor element R6 to which the current Iout2 is supplied. Since a voltage drop across the resistor element R6, which exhibits a linear gradient of the current-voltage conversion characteristic, is included, negative feedback of the voltage V2 provides greater feedback gain than positive feedback of the voltage V1. Thus, when the positive feedback and the negative feedback are combined in the differential amplifier circuit 100E, the negative feedback is dominant, which enables the voltages V1 and V2 and the output voltage Vbgr to be kept stable at their certain values.

Accordingly, the differential amplifier circuit 100E operates so as to make the voltage V1 equal to the voltage V2, and outputs the stable output voltage Vbgr. Also in the configuration described above, the back gates of the P-channel MOSFETs (MP1 and MP2) constituting the differential pair are connected to the gates thereof, which enables negative feedback to be strongly exerted. Therefore, even if two MOSFETs constituting a differential pair have a weak paired relationship, the differential amplifier circuit 100E can eliminate or reduce variations in the output voltage Vbgr.

While this embodiment provides a configuration in which the amount of the current Iout1 and the amount of the current Iout2 are equal and the diode D1 and the diode D2 have different sizes, the combinations of currents and diodes are not limited to those given in this configuration. For example, the amount of the current Iout1 may be greater than the amount of the current Iout2, and the diode D1 and the diode D2 may have an equal size.

In addition, the diodes D1 and D2 are not limited to diodes, but may be a load. For example, instead of the diodes D1 and D2, other devices such as diode-connected bipolar transistors may be used.

Figure 8:
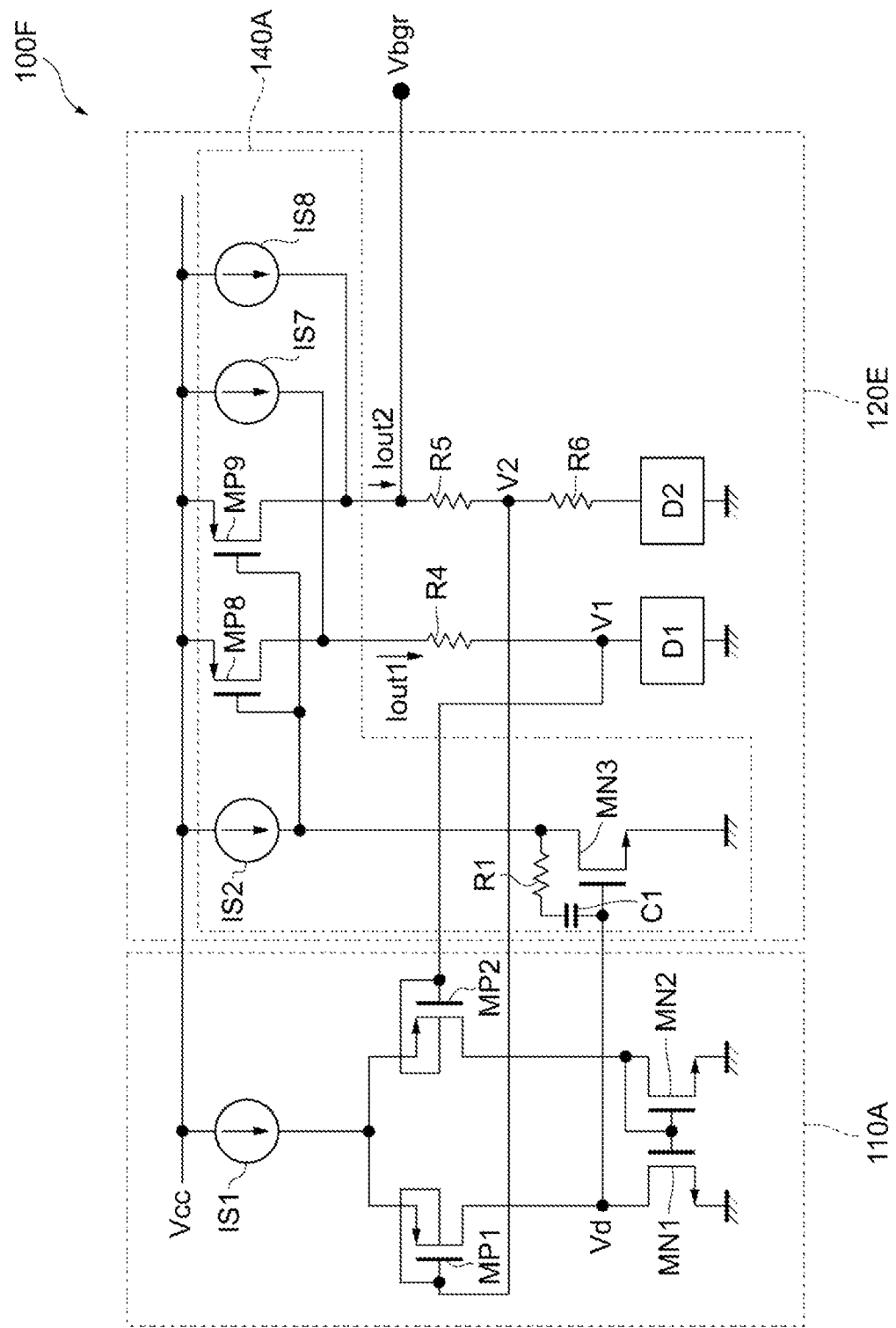
FIG. 8 is a circuit diagram illustrating the configuration of a differential amplifier circuit according to a sixth embodiment of the present disclosure.

FIG. 8 is a circuit diagram illustrating the configuration of a differential amplifier circuit 100F according to a sixth embodiment of the present disclosure. The differential amplifier circuit 100F illustrated in FIG. 8 includes a current source 140A, which is a specific example configuration of the current source 140 in the differential amplifier circuit 100E illustrated in FIG. 7.

The current source 140A includes, for example, an N-channel MOSFET (MN3), P-channel MOSFETs (MP8 and MP9), a resistor element R1, a capacitor C1, and current sources IS2, IS7, and IS8. The configuration of the N-channel MOSFET (MN3), the resistor element R1, the capacitor C1, and the current source IS2 is similar to that in the output circuit 120A illustrated in FIG. 1 and will not be described in detail.

The P-channel MOSFETs (MP8 and MP9) have sources to which the power supply voltage Vcc is supplied, gates connected to the drain of the N-channel MOSFET (MN3), and drains connected to ends of the resistor elements R4 and R5, respectively.

The current sources IS7 and IS8 continuously supply current to the ends of the resistor elements R4 and R5, respectively, so that the voltages V1 and V2 become voltages higher than 0 V. This prevents the voltages V1 and V2 from remaining stable at 0 V and from malfunctioning.

With the configuration described above, the current source 140A generates and outputs the currents Iout1 and Iout2 corresponding to the drain voltage Vd of the N-channel MOSFET (MN1). Specifically, for example, when the drain voltage Vd is increased, the current flowing through the N-channel MOSFET (MN3) is increased. This causes a reduction in the gate voltages of the P-channel MOSFETs (MP8 and MP9). Accordingly, the currents flowing through the P-channel MOSFETs (MP8 and MP9) (i.e., the currents Iout1 and Iout2) are increased. In contrast, when the drain voltage Vd is decreased, in accordance with the operation opposite to that described above, the currents flowing through the P-channel MOSFETs (MP8 and MP9) (i.e., the currents Iout1 and Iout2) are decreased.

In this way, the configuration of the differential amplifier circuit 100F can achieve operations similar to those of the differential amplifier circuit 100E. Therefore, even if two MOSFETs constituting a differential pair have a weak paired relationship, the differential amplifier circuit 100F can eliminate or reduce variations in the output voltage Vbgr.

Figure 9:
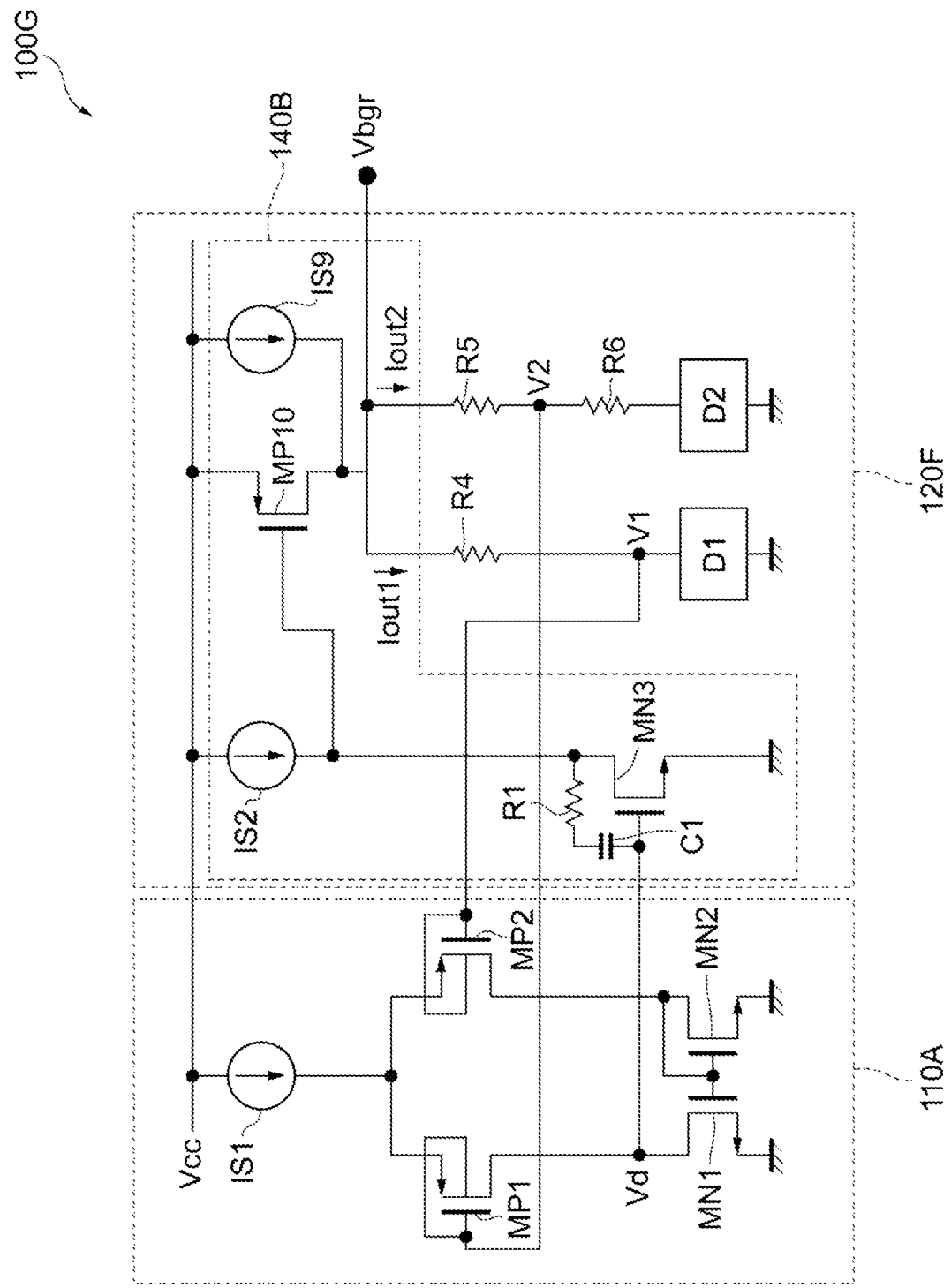
FIG. 9 is a circuit diagram illustrating the configuration of a differential amplifier circuit according to a seventh embodiment of the present disclosure.

FIG. 9 is a circuit diagram illustrating the configuration of a differential amplifier circuit 100G according to a seventh embodiment of the present disclosure. The differential amplifier circuit 100G illustrated in FIG. 9 includes a current source 140B, which is a modification of the current source 140A in the differential amplifier circuit 100F illustrated in FIG. 8.

Specifically, the current source 140A illustrated in FIG. 8 includes two combinations, each including a P-channel MOSFET and a current source, and each generating one of the currents Iout1 and Iout2. In the current source 140B illustrated in FIG. 9, a current generated by a combination of a P-channel MOSFET and a current source is distributed into the currents Iout1 and Iout2.

That is, a P-channel MOSFET (MP10) has a source to which the power supply voltage Vcc is supplied, a gate connected to the drain of the N-channel MOSFET (MN3), and a drain connected to an end of the resistor element R4 and an end of the resistor element R5. A current source IS9 continuously supplies current to the ends of the resistor elements R4 and R5. A current generated by the P-channel MOSFET (MP10) is distributed into the currents Iout1 and Iout2 which are supplied to the resistor elements R4 and R5, respectively. As described above, the negative feedback exerted in the differential amplifier circuit 100G makes the voltage V1 and the voltage V2 equal. Thus, for example, if the resistor element R4 and the resistor element R5 have an equal resistance value, an equal voltage drop occurs across the resistor element R4 and the resistor element R5. Accordingly, the amount of the current Iout1 and the amount of the current Iout2 are equal.

The configuration described above can also achieve the current source 140 illustrated in FIG. 7. Accordingly, the differential amplifier circuit 100G can achieve advantages similar to those of the differential amplifier circuit 100F. In addition, the differential amplifier circuit 100G only requires one combination of a P-channel MOSFET and a current source, unlike the differential amplifier circuit 100F, and can thus reduce the circuit size.

Exemplary embodiments of the present disclosure have been described. In the differential amplifier circuits 100A to 100G, the back gates of the P-channel MOSFETs (MP1 and MP2) or the N-channel MOSFETs (MN4 and MN5) constituting the differential pair are connected to the gates thereof, and a voltage corresponding to the output voltage Vout or Vbgr is input to the gate of one of the MOSFETs. Thus, a change in the gate voltage of the P-channel MOSFET (MP2) or the N-channel MOSFET (MN5) causes a change in back-gate voltage, which results in a change in the threshold voltage for the MOSFET. Accordingly, the differential amplifier circuits 100A to 100G allow negative feedback to be strongly exerted, which can eliminate or reduce variations in the output voltage Vout or Vbgr.

In the differential amplifier circuit 100A or 100B, the input voltage Vin is input to the gate of one of a differential pair, namely, the P-channel MOSFET (MP1) or the N-channel MOSFET (MN4), and the output voltage Vout is input to the gate of the other MOSFET, namely, the P-channel MOSFET (MP2) or the N-channel MOSFET (MN5). As a result, a voltage follower circuit with eliminated or reduced variations in the output voltage Vout is achieved.

The differential amplifier circuit 100D further includes the resistor elements R2 and R3, which are connected in series between a terminal from which the output voltage Vout is output and ground, and a voltage at the node of the resistor elements R2 and R3 is input to the gate of the N-channel MOSFET (MN5). Accordingly, a boost regulator circuit with eliminated or reduced variations in the output voltage Vout is achieved.

The differential amplifier circuit 100C further includes the P-channel MOSFETs (MP6 and MP7) whose back gates are connected to the gates thereof. The input voltage Vin is boosted by an amount corresponding to the gate-source voltage of the P-channel MOSFET (MP6) and is then input to the gate of the N-channel MOSFET (MN4). The output voltage Vout is boosted by an amount corresponding to the gate-source voltage of the P-channel MOSFET (MP7) and is then input to the gate of the N-channel MOSFET (MN5). In the differential amplifier circuit 100C, therefore, the lower limits of the input voltage Vin and the output voltage Vout are lower than those in the differential amplifier circuit 100B. Accordingly, the differential amplifier circuit 100C can shift the dynamic range toward the ground potential.

Each of the differential amplifier circuits 100E to 100G further includes the current source 140 (or 140A or 140B) that outputs a current corresponding to a voltage output from the initial-stage circuit 110A, the resistor elements R4 and R5 for setting the output voltage Vbgr, the diodes D1 and D2, and the resistor element R6, the diodes D1 and D2 and the resistor element R6 being configured to generate the voltages V1 and V2 in accordance with the output currents of the current source 140 (or 140A or 140B). The voltage V2 is input to the gate of one of the differential pair, namely, the P-channel MOSFET (MP1), and the voltage V1 is input to the gate of the other MOSFET, namely, the P-channel MOSFET (MP2). As a result, a positive feedback loop including the P-channel MOSFET (MP2) is formed. A negative feedback loop including the P-channel MOSFET (MP1), which has a larger gain, is further formed. These feedback loops are combined to obtain a negative feedback loop. Accordingly, a bandgap reference circuit with eliminated or reduced variations in the output voltage Vbgr is achieved.

The differential amplifier circuits 100A to 100G described above may be applied to any circuit. For example, a power amplifier circuit incorporated in a mobile communication device such as a cellular phone may include any of the differential amplifier circuits 100A to 100G to generate a reference voltage for a bias circuit that supplies a bias current or voltage to an amplifier. The reference voltage is stably supplied, thereby enabling a bias current or voltage to be stably generated.

In the differential amplifier circuits 100A to 100G described above, furthermore, P-channel MOSFETs and N-channel MOSFETs are illustratively distinguished from each other and may be interchangeably used.

The embodiments described above are intended to help easily understand the present disclosure and are not to be used to construe the present disclosure in a limiting fashion. The present disclosure may be modified or improved without departing from the gist thereof, and equivalents of such modifications or improvements are also included in the present disclosure. That is, the embodiments may be appropriately modified in design by those skilled in the art, and such modifications also fall within the scope of the present disclosure so long as the modifications include the features of the present disclosure. For example, elements included in the embodiments and the arrangements, materials, conditions, shapes, sizes, and so on thereof are not limited to those illustrated exemplarily but can be modified as appropriate. Elements included in the embodiments can be combined as much as technically possible, and such combinations of elements also fall within the scope of the present disclosure so long as the combinations of elements include the features of the present disclosure.

While embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A bandgap reference circuit comprising:
a differential transistor pair including a first field-effect transistor and a second field-effect transistor; and
a first current source configured to generate a current that flows through the first field-effect transistor and the second field-effect transistor;
wherein a back gate of the first field-effect transistor is connected to a gate of the first field-effect transistor,
wherein a back gate of the second field-effect transistor is connected to a gate of the second field-effect transistor, and
wherein the back gate of the first field-effect transistor is connected to the gate of the first field-effect transistor independently of the back gate of the second field-effect transistor being connected to the gate of the second field-effect transistor.

2. The bandgap reference circuit according to claim 1, further comprising:
a third current source configured to generate a first current and a second current in accordance with an output voltage, the output voltage being in accordance with an operation of the differential transistor pair;
a third load configured to convert the first current into a first feedback voltage; and
a fourth load configured to convert the second current into a second feedback voltage,
wherein the second feedback voltage is supplied to the gate of the first field-effect transistor, forming a negative feedback loop including the first field-effect transistor, and
wherein the first feedback voltage is supplied to the gate of the second field-effect transistor, forming a positive feedback loop including the second field-effect transistor.

3. The bandgap reference circuit according to claim 1, wherein the first field-effect transistor and the second field-effect transistor are P-channel metal oxide semiconductor field-effect transistors.

4. The bandgap reference circuit according to claim 1, wherein the first field-effect transistor and the second field-effect transistor are N-channel metal oxide semiconductor field-effect transistors.

5. The bandgap reference circuit according to claim 2, wherein the first feedback voltage is equal to the second feedback voltage.

6. The bandgap reference circuit according to claim 2, wherein the first current is equal to the second current.

7. The bandgap reference circuit according to claim 2, wherein:
the third load comprises a resistor and a first diode, and
the fourth load comprises a voltage divider circuit and a second diode.

8. The bandgap reference circuit according to claim 2, wherein the third current source is supplied with a drain voltage of the first field-effect transistor.

9. The bandgap reference circuit according to claim 8, wherein the third current source is configured to output the first current and the second current such that the first current and the second current increase as the drain voltage increases.

* * * * *